(12) United States Patent
Volant et al.

(10) Patent No.: US 6,831,542 B2
(45) Date of Patent: Dec. 14, 2004

(54) MICRO-ELECTROMECHANICAL INDUCTIVE SWITCH

(75) Inventors: Richard P. Volant, New Fairfield, CT (US); John E. Florkey, Pleasant Valley, NY (US); Robert A. Groves, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 10/248,876

(22) Filed: Feb. 26, 2003

(65) Prior Publication Data

US 2004/0164825 A1 Aug. 26, 2004

(51) Int. Cl.$^7$ .............................................. H01F 21/04
(52) U.S. Cl. ....................... 336/115; 336/121; 336/122; 336/123; 336/232
(58) Field of Search ........................ 336/115–129, 232

(56) References Cited

U.S. PATENT DOCUMENTS

| | | | |
|---|---|---|---|
| 5,998,906 A | 12/1999 | Jerman et al. | |
| 6,074,890 A | 6/2000 | Yao et al. | |
| 6,184,755 B1 | * 2/2001 | Barber et al. | ............... 331/181 |
| 6,305,779 B1 | 10/2001 | Capurso et al. | |
| 6,328,903 B1 | 12/2001 | Vernon, Sr. | |
| 6,404,599 B1 | 6/2002 | Vigna | |
| 6,465,929 B1 | 10/2002 | Levitan et al. | |

* cited by examiner

Primary Examiner—Ramon M. Barrera
(74) Attorney, Agent, or Firm—H. Daniel Schnurmann

(57) ABSTRACT

A micro-electro mechanical (MEM) switch capable of inductively coupling and decoupling electrical signals is described. The inductive MEM switch consists of a first plurality of coils on a movable platform and a second plurality of coils on a stationary platform or substrate, the coils on the movable platform being above or below those in the stationary substrate. Coupling and decoupling occurs by rotating or by laterally displacing the coils of the movable platform with respect to the coils on the stationary substrate. Diverse arrangements of coils respectively on the movable and stationary substrates allow for a multi-pole and multi-position switching configurations. The MEM switches described eliminate problems of stiction, arcing and welding of the switch contacts. The MEMS switches of the invention can be fabricated using standard CMOS techniques.

17 Claims, 25 Drawing Sheets

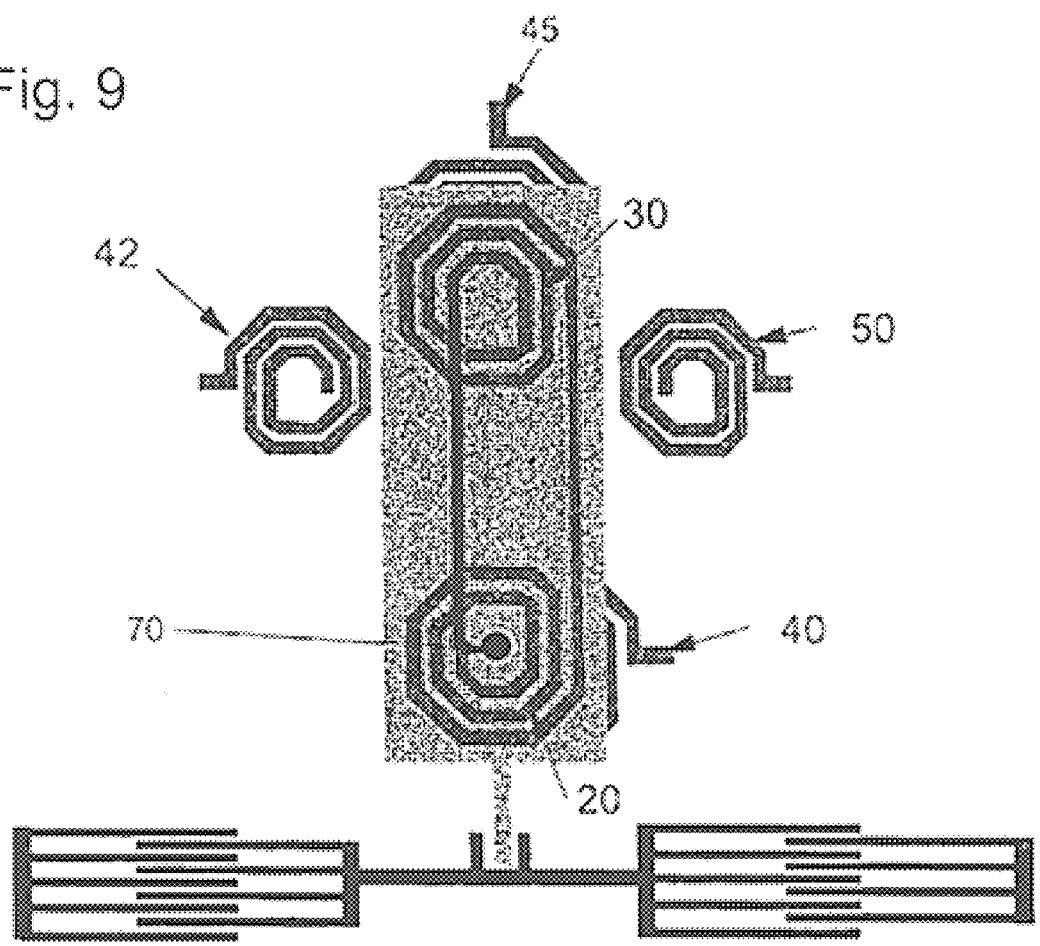

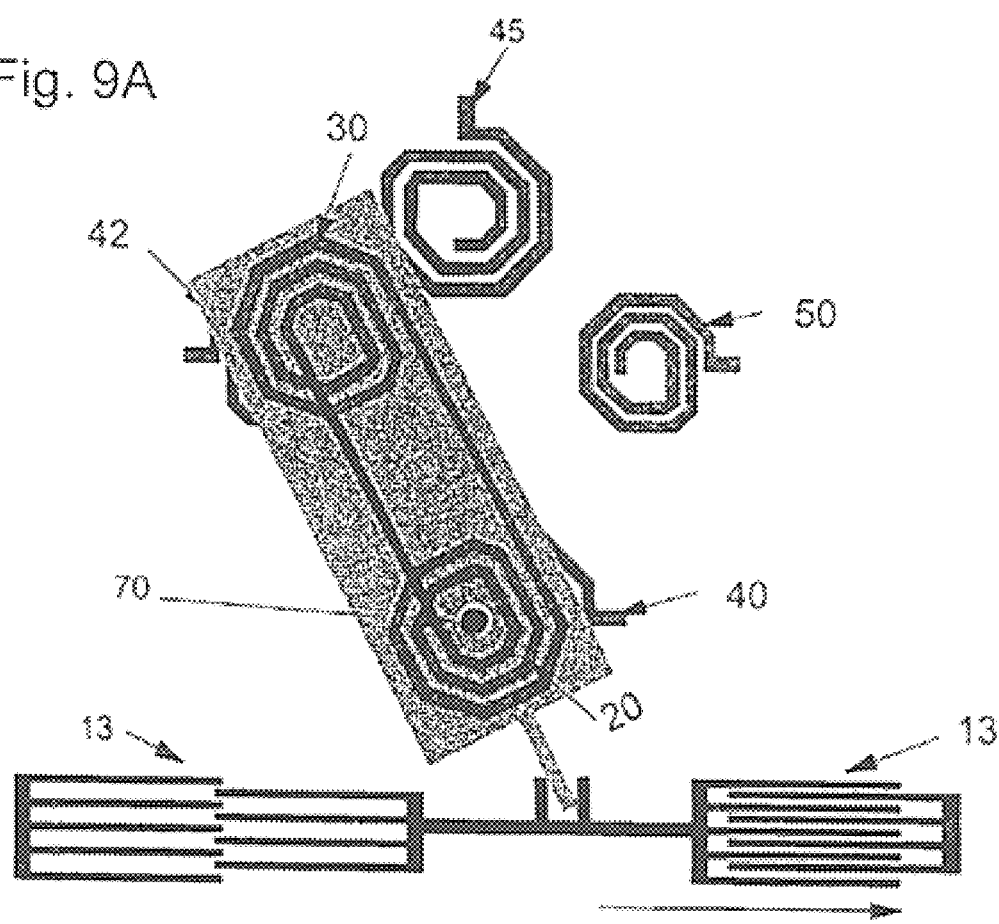

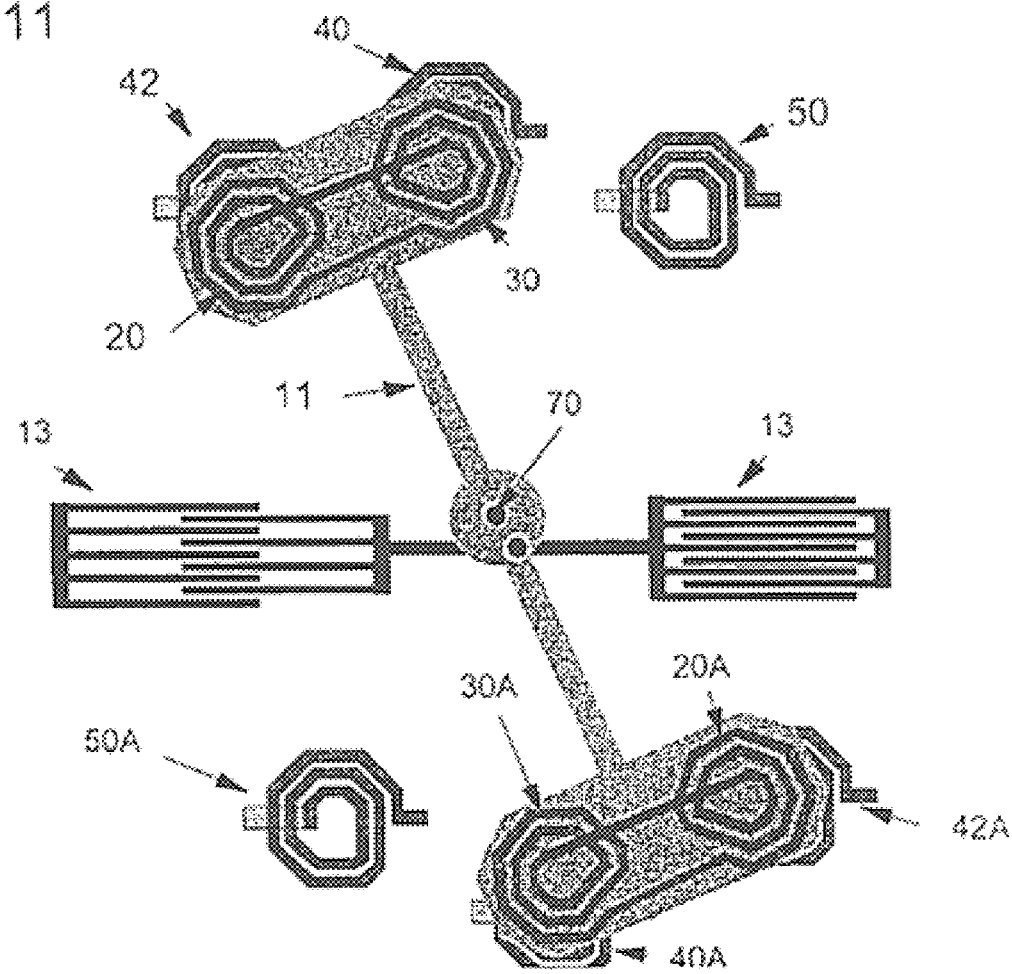

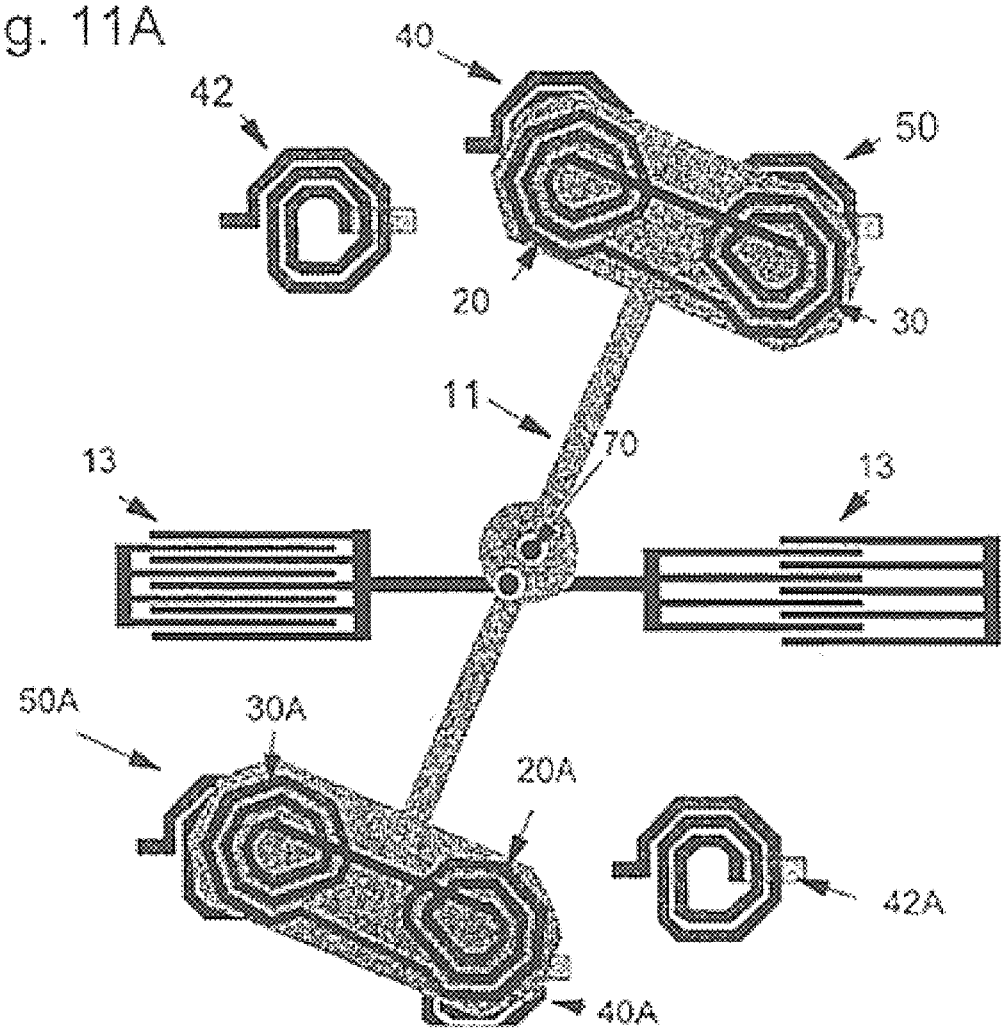

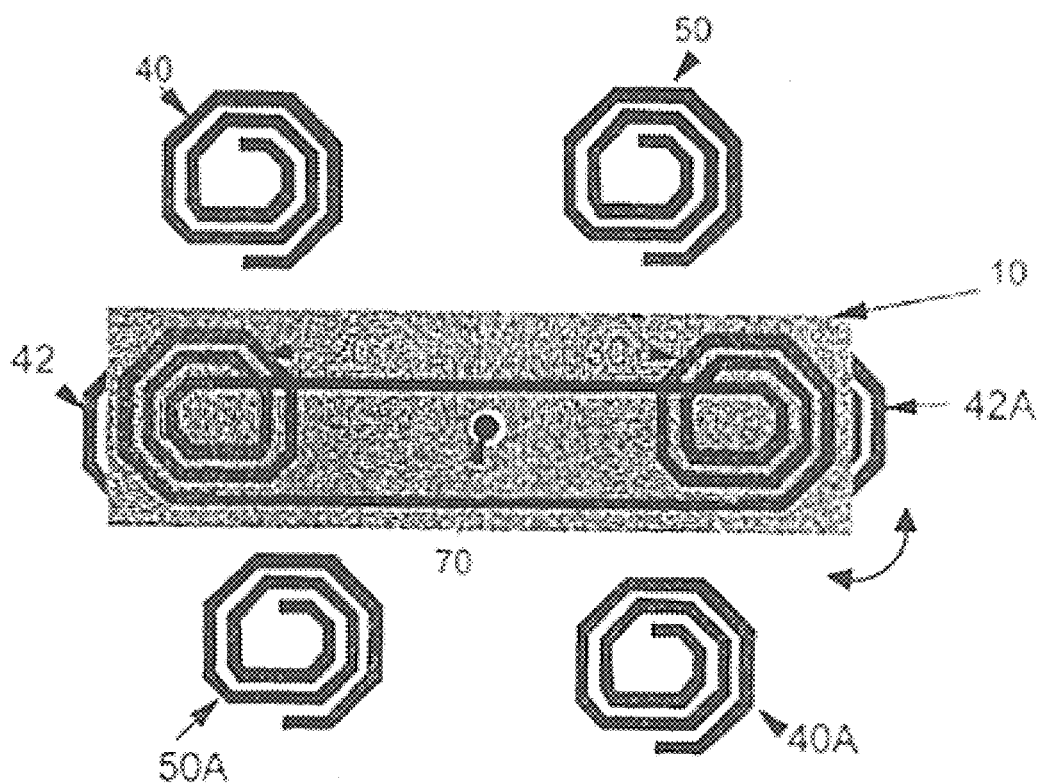

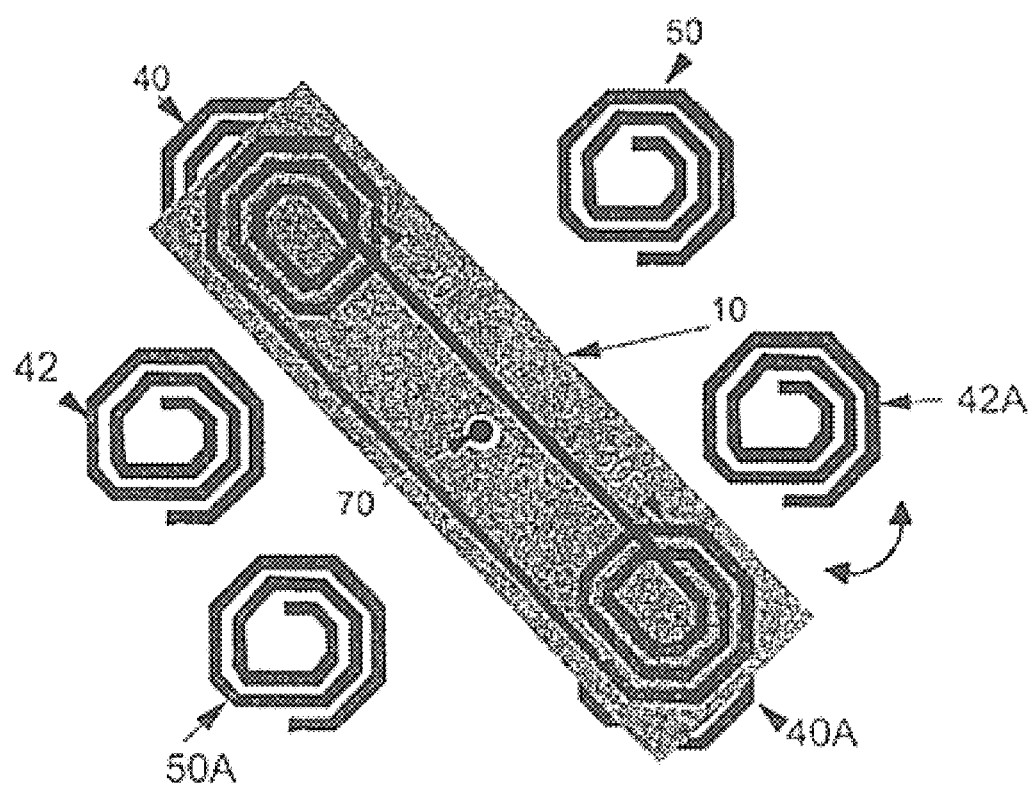

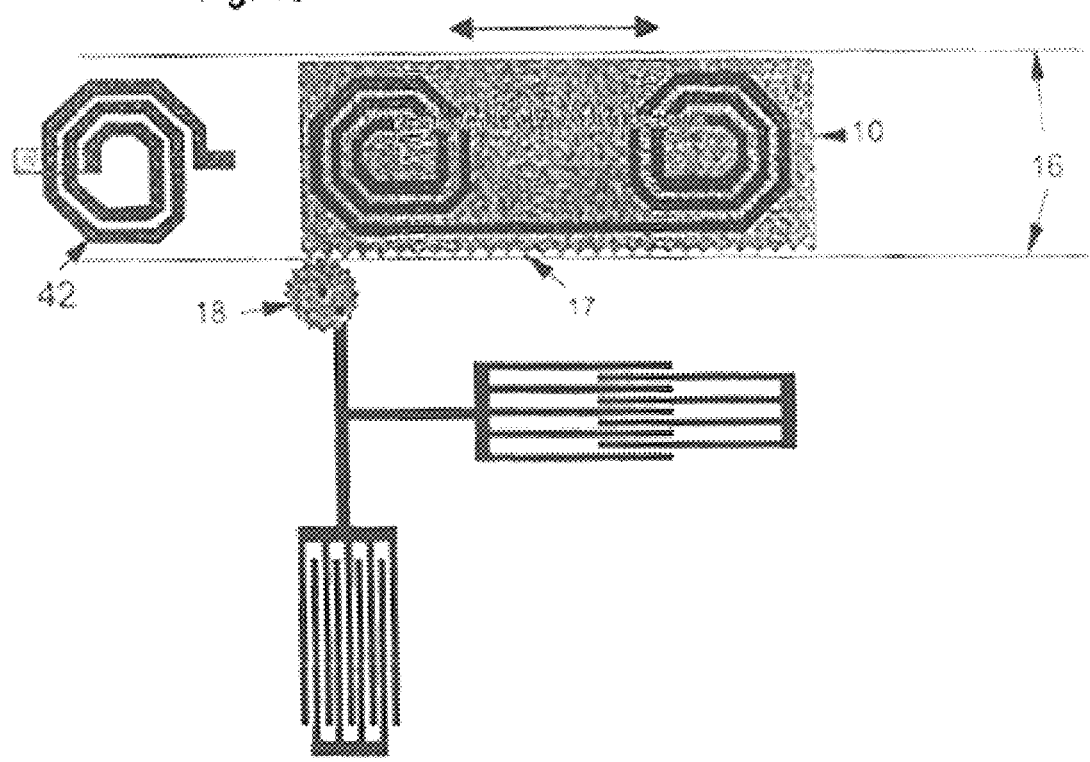

MICRO-ELECTROMECHANICAL INDUCTIVE SWITCH

BACKGROUND OF INVENTION

This invention is generally related to micro-electro mechanical systems (MEMS) especially MEMS switches, and more specifically, to an inductive MEMS switch utilizing inductive coupling and decoupling, and which is fully compatible with standard CMOS manufacturing materials and processes.

Switching operations are a fundamental part of many electrical, mechanical and electro mechanical applications. MEMS switches have drawn considerable interest over the last few years. Products using MEMS switch technology are widespread in biomedical, aerospace and communications systems.

MEMS switches have been manufactured using various configurations, they are electrostatically controlled beams that make metal-to-metal contact or a similar structure that uses a dielectric stop to form a capacitive switch. A common feature that characterizes the device is that it is provided with at least one moving element contacting another to complete the circuit.

In order to better understand the present invention, a conventional MEMS switch will now be described with reference to FIG. 1, showing a cross-section view of a MEMS switch having both ends of a deformable beam 5 anchored on dielectric 2. The lowest level consists of a dielectric material 1 consisting of conductive elements 3 and 4 which are used to connect or form the various electrical components of the device. Conductors referenced by numerals 3 and 6 are used to provide an operating voltage potential that causes the beam to bend (or deform). Conductor 4, which conducts an electrical signal, contacts the deformable beam when the MEMO switch is in operation. FIG. 2 shows a top-down view of the same conventional switch.

In a typical implementation of a conventional MEMO switch, the contact beam is formed by depositing polysilicon over a dielectric made of, e.g., SiO2. The surrounding material is etched away leaving a raised structure that is attached to silicon beam 5. The contact element 6, anchored at one end on silicon beam 5 is suspended at its other end above conductors 3 and 4, and is preferably made of polysilicon. Subsequently, the device is subjected to electroless plating, usually of gold, that adheres to the polysilicon to complete the fabrication of conductive elements 3, 4 and 6.

The switch is operated by providing a potential difference between contact beam 6 and electrode 3. This voltage generates an electrostatic attraction that brings beam 6 in contact with electrode 4, thus closing the switch. The twist imparted to the anchored beam 5 is used to restore the contact 6 to its open position once the control voltage potential is dropped.

Generally, all conventional MEMS switches rely upon physical contact, especially metal-to-metal contact to perform the switching operation. This leads to many reliability problems related to arcing, material transfer, micro-welding, station, and the like. It is well known in the art that most of these switches become less reliable at higher frequencies. Some of the metallurgies used, such as gold, that are commonly used in an attempt to alleviate these problems are not compatible with standard CMOS fabrication. The inductive MEMS switch of the present invention which will be described hereinafter lends itself to be operated by any number of well known MEMS actuators.

Examples of MEMS actuators can be found at the Sandia National Laboratory web site (www.sandia.gov), or in several MEMS patents related to actuators such as U.S. Pat. No. 6,328,903, George E. Vernon, Sr., "Surface-Micromachined Chain for Use in Micro-Mechanical Structures", issued Dec. 11, 2001. Other patents specifically directed to comb drive systems described hereinafter are to be found, for instance, in U.S. Pat. No. 5,998,906, Jerman et al., "Electrostatic Microactuator and Method for Use Thereof", issued Dec. 7, 1999.

In conventional MEMS switches, as described, for instance, in U.S. Pat. No. 6,074,890, Yao et al., Method of Fabricating Suspended Single Crystal Silicon MEMS Devices", issued Jun. 13, 2000, and further described in IEEE Microwave issued December 2001, typically, at least one electrode in the switching circuit has a DC potential applied as part of the electrostatic actuation. Thus, a distinct need exists to separate the drive system from the switching circuit such that no DC control voltage is applied to at least one contact in order to perform electrostatic actuation.

SUMMARY OF INVENTION

Accordingly, it is an object of the invention to provide an inductive MEMS switch based on inductive coupling and decoupling of electrical signals.

It is another object to provide an inductive MEMS switch that isolates the control signal from the switched signals by separating the path of the switched signal from the control circuit used to operate the device.

It is still another object to provide an inductive MEMS switch having an off-state isolation that surpasses a conventional switch in the off-state, and which are typically limited to provide isolation of about 50 dB at 6 GHz.

It is a further object to provide an inductive MEMS switch that may be configured in a variety of multi-pole, multi-throw arrangements and which is controlled by any number of MEMS linear or rotary drive systems.

It is yet another object to provide an inductive MEMS switch that can reliably perform "hot-switching", namely, switching while operating under nominal power levels. Switching can be achieved at 1 watt, 5 watts up to whatever value the remaining part of the circuit cansince the switching is non-contact and, thus, there is no arcing or welding of contacts.

It is still another object to provide an inductive MEMS switch that operates reliably with no DC potential or physical contact point in the signal path which can potentially lead to arcing, welding or material transfer and degradation.

It is still a further object to provide an inductive MEMS switch that increases its efficiency at higher frequencies, allowing the size of the coils to decrease when the frequency of the signal increases, the increase in efficiency being achieved by magnetic field coupling between the switch components, thus providing better insertion loss characteristics at higher frequencies without a corresponding decrease in isolation performance.

It is another object of the invention to provide a switch/transformer combination for achieve impedance matching. By selecting the inductance of each portion of the inductive switch appropriately, the input and output impedance of the switch can be adjusted independently. This adjustment allows for impedance matching and switching at the same time. A special configuration of the transformer can be utilized to create a single-ended to double-ended converter or balun (BAlanced-UNbalanced), providing both switching and signal conversion in a single device.

It is still a further object to provide an inductive MEMS switch that can be manufactured using CMOS compatible processes and materials.

In one aspect of the invention, switching of the signal is accomplished by inductive coupling and decoupling between stationary coils and movable coils. Switching occurs as the movable coils are or not aligned with respect to the stationary coils.

A four turn spiral inductor, with a metal thickness of 4 µm, a turn width of 10 µm, and an outer diameter of 150 µm, configured as one element of the switch, is magnetically coupled to another similar spiral, directly above or below, yielding a coupling coefficient of about 0.85. When these spirals are configured as described, a closed-switch insertion loss of 6.6 dB and a opened-switch isolation of 65 dB is achieved at 13 Ghz. This yields an excellent on-off switch ratio tuned to frequencies below 13 Ghz by adding an external tuning capacitor between the two ports of the switch. Similarly, a one and a half turn spiral inductor, with a metal thickness of 4 µm, a turn width of 10 µm, and an outer diameter of 150 µm, configured as one element of the switch, is magnetically coupled to another similar spiral, directly above or below, yielding a coupling coefficient of about 0.85. When the spirals are configured as such, a closed-switch insertion loss of 10 dB and an opened-switch isolation of 60 dB is achieved at 25 Ghz. This yields an excellent on-off switch ratio tuned to frequencies below 25 Ghz by the addition of an external tuning capacitor between the two ports of the switch.

In another aspect of the invention, the present. MEMS switch solves problems known as stiction, arcing and welding of the switch contacts, all of which are eliminated because of a lack of physical contact between the switching elements. The coils are simply aligned in close proximity such that inductive coupling can transfer the signal between one and the other. In view of this characteristic, the MEMS switch can easily handle switching at full power (hot switching) and, clearly more power than a conventional MEMS switch.

Multiple switch configurations are realized by varying the number of stationary or movable coils, and/or by altering the coil geometric configuration of the coils and the corresponding displacement of the movable elements. Additionally, total isolation from the control signal and the switched signal path is possible since the drive circuit is totally independent of the switching circuit.

BRIEF DESCRIPTION OF DRAWINGS

These and other objects, aspects and advantages of the invention will become apparent from the following detailed description of preferred embodiments of the invention, when taken in conjunction with the accompanying drawings.

FIG. 3 illustrates the switch positioned in a decoupled mode to better view the stationary coils.

FIG. 9 illustrates an arrangement wherein the pivot is moved to the interior of one of the movable coils. Also shown is the coil coupled to stationary coil 40 to provide a multi-throw switch.

FIG. 11 is an extension of FIG. 10 which provides added functionality as a multi-pole switch.

FIG. 12 shows an arrangement that uses a rotary drive for a multi-position MEMS switch.

FIG. 13 illustrates an arrangement showing a linear (or rack) and pinion drive to provide transversal motion to the MEMS switch of the present invention.

DETAILED DESCRIPTION

The present invention will now be described more fully with reference to the drawings, in which preferred embodiments are shown.

Figure 1:
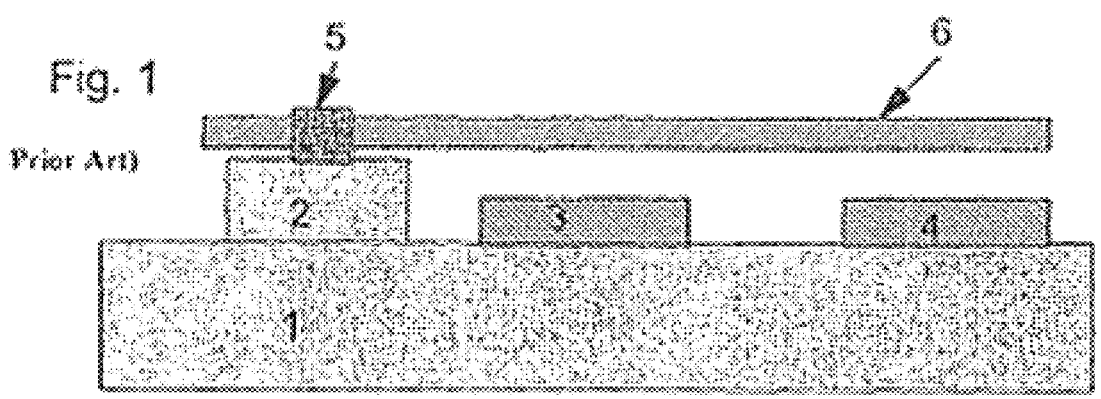
FIGS. 1 and 2 are schematic diagrams respectfully showing a cross-section and a top-down view of a prior art MEMS switch.
Figure 2:
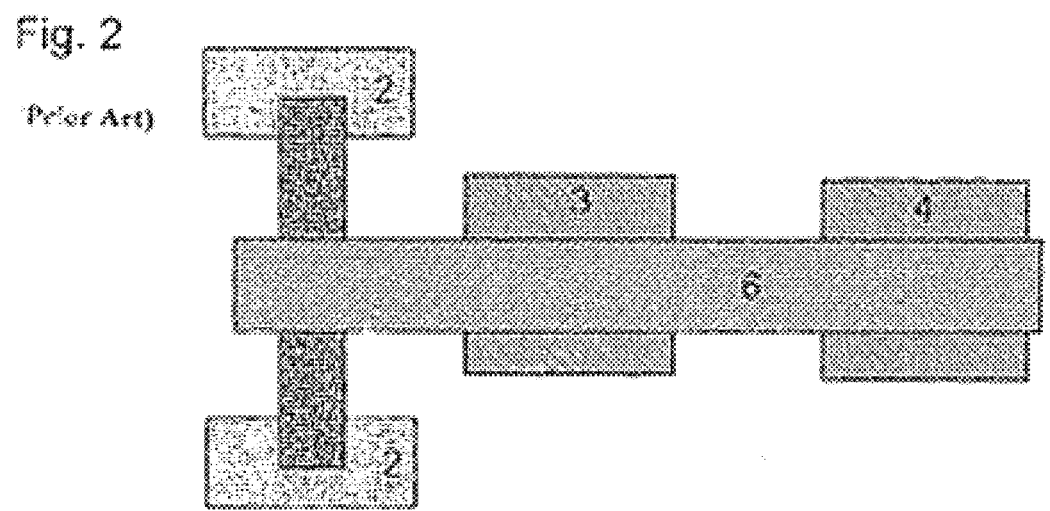
Figure 3:
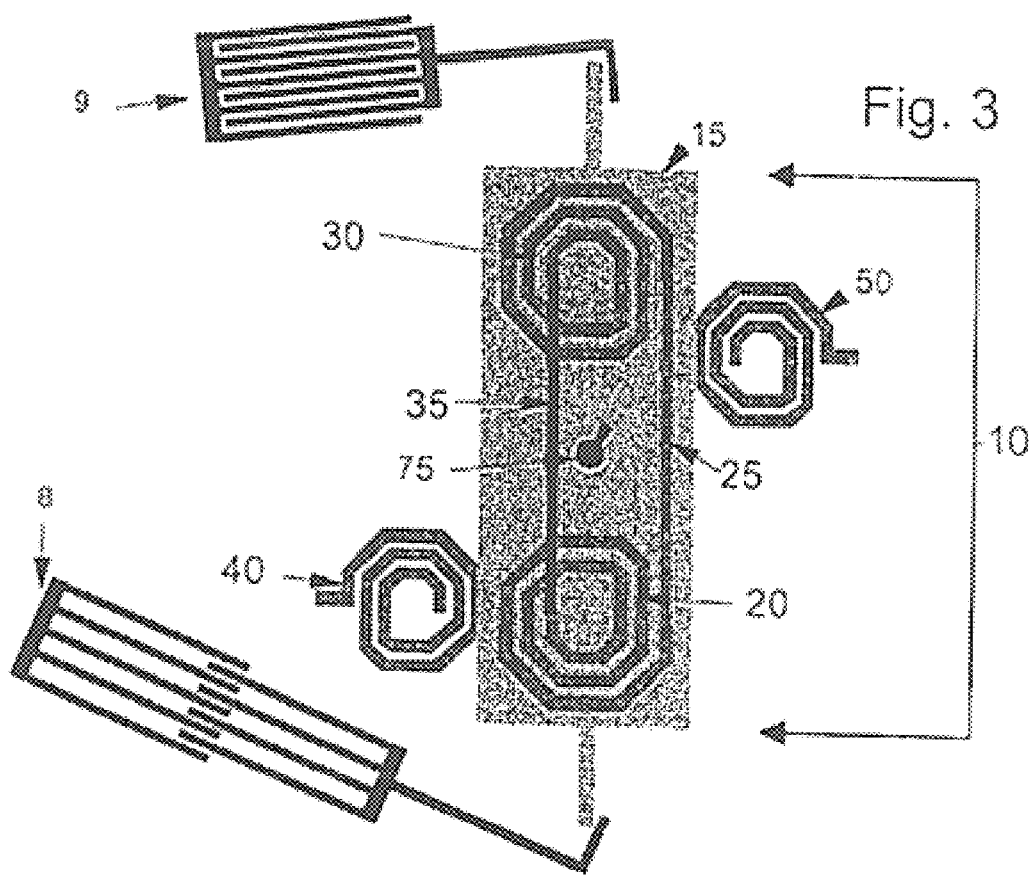
FIG. 3 shows a first embodiment of the invention, wherein a module of movable inductors rotate about a pivot pin to inductively couple and decouple one set of coils from another. Also shown are comb drives illustrating one possible mode of operation.

FIG. 3 is a schematic diagram of a first embodiment illustrating the invention in its simplest form. A movable coil assembly 10 consisting of a substrate, platform or module 15 of movable inductors 20 and 30 that rotate about pivot pin 70, inductively coupling and decoupling the movable coils 20 and 30 to and from stationary coils 40 and 50 positioned on a second substrate above or below platform 15. Comb drives 8 an 9 provide driving capabilities to the assembly to illustrate one mode of operation, although other drive systems can be used just as effectively. Subsequent figures will show the device positioned in both positions in order to better illustrate the relative position of the movable coils with respect to the stationary coils.

The two inductors 20 and 30 are connected to close the circuit through conductors 25 and 35 such that any current flow induced in one coil flows through the other. Pivot pin 70 passes through hole 75 (illustrated in more detail in FIG. 6). Inductors 40 and 50 are positioned on an underlying substrate 7 (shown in FIG. 6), and are connected to other circuitry requiring a switching mechanism, such as a power amp, a receiver and an antenna.

The mechanism by which rotation is achieved is not an element of the present embodiment. Practitioners of the art will readily recognize that there are any number of MEMS switches that can be accommodated to provide the required movement to device. An example of such a device is found, for instance, in U.S. Pat. No. 6,074,890 "Method of Fabricating Suspended Single Crystal Silicon MEMS devices" to Yao et al., which describes a method of fabricating a simple comb drive or in U.S. Pat. No. 6,465,929 "Micro-electro mechanical system actuator for extended linear motion" to Levitan, et al., both of which are incorporated herein be reference.

Figure 4:
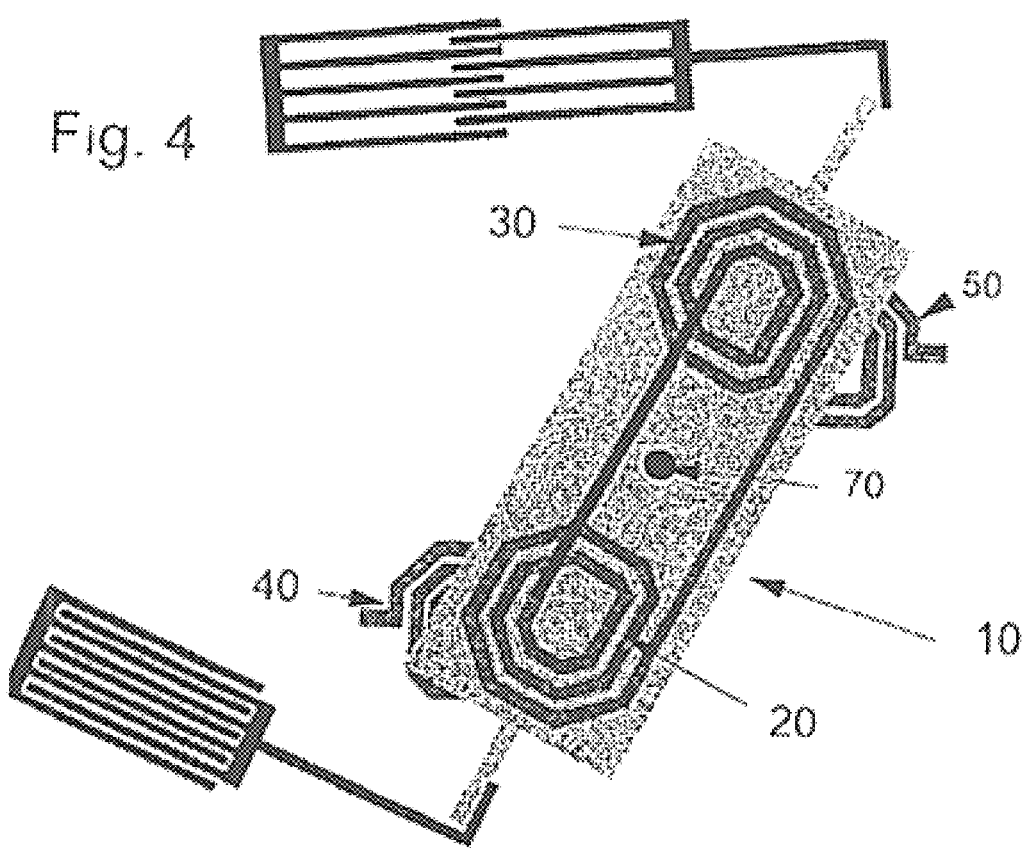
FIG. 4 is the same device shown of FIG. 3, but substantially rotated to illustrate the mode of coupling the movable inductors to the stationary inductors, in accordance with the present invention.

FIG. 4 illustrates the MEMS switch of FIG. 3 rotated to a position where the coils are inductively coupled, namely, movable inductor 20 to stationary inductor 40 while movable coil 30 is coupled to stationary coil 50. In this manner, a signal injected into coil 40 can be inductively transferred to coil 20. An electric signal is transferred to coil 30 which, in turn, inductively couples it down to coil 50. Thus, an electric signal from, e.g., a transmitter power amp is applied to coil 40, and the signal flows through the device to coil 50 which may, in turn, connected to, e.g., an antenna. It should be noted that additional coils may be part of the assembly to achieve additional functionality. This will be illustrated hereinafter with reference to FIGS. 9–10, 13, and 18–20.

Figure 5:
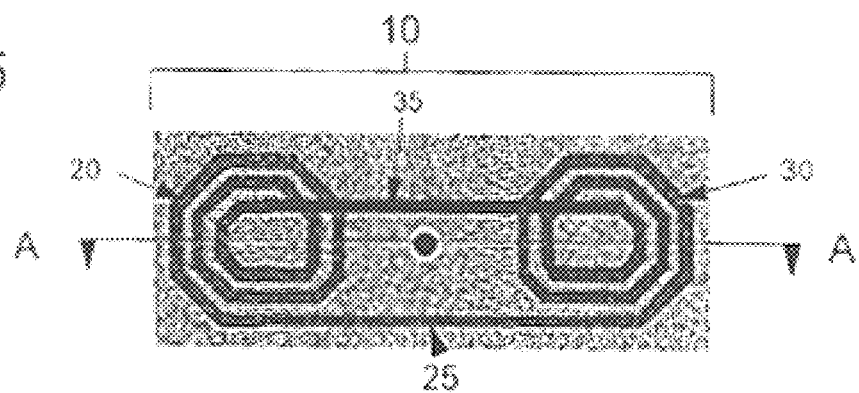
FIG. 5 is a top-down view of the movable coil arrangement. The delimiter A—A shows the cross-section view to be used in FIG. 6.

FIG. 5 is a top-down view of assembly 10 illustrating coils 20 and 30 and their inner and outer coil connections 35 and 25, respectively. Also shown is a delimiter A—A that will be used hereinafter with reference to FIG. 6.

Figure 6:
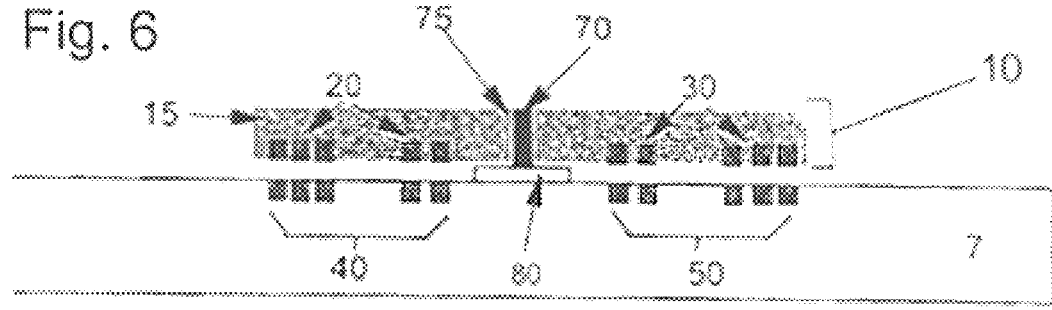
FIG. 6 is a cross-section view of FIG. 5 through delimiter A—A. Also shown is relevant part of the underlying substrate containing the stationary coils 40 and 50, the pivot hole and the pivot pin about which the device rotates.

FIG. 6 is a cross-section view of FIG. 5 taken through line A—A. Illustrated herein is lower substrate 7 which contains the stationary coils and possibly other related circuitry (not shown herein for clarity). A shoulder 80 surrounding pivot pin 70 is constructed on substrate 7. This shoulder provides the necessary clearance to allow device 10 to move. The height of the shoulder determines this clearance and to some degree, the level of efficiency of coupling the coils. The shoulder is on the order of 1000 Å to over 2 $\mu$m thick, depending on the specific application. The pivot pin 70 is contained within the area of the shoulder and its size is determined by the ability of device 10 to move freely thereat without binding or significant wobble. The diameter of the pivot should be sufficient to provide the necessary mechanical reliability, and it is scaled accordingly. Its diameter is also influenced by the selection of the material and by the process capabilities. Likewise, hole 75 in device 10 is designed to accommodate the pivot pin such that the desired range of motion occurs without binding. The height of the pivot is scaled to conform to the thickness of device 10. By way of example, if device 10 is 3 $\mu$m thick, then the pivot will occupy a substantial portion of the thickness in order to reliably retain the device. Preferentially, the pivot is made slightly taller that the thickness of device 10 so that the top shoulder 85 (see FIG. 14) is contacted by the pivot to enclose and retain the device.

Figure 7:
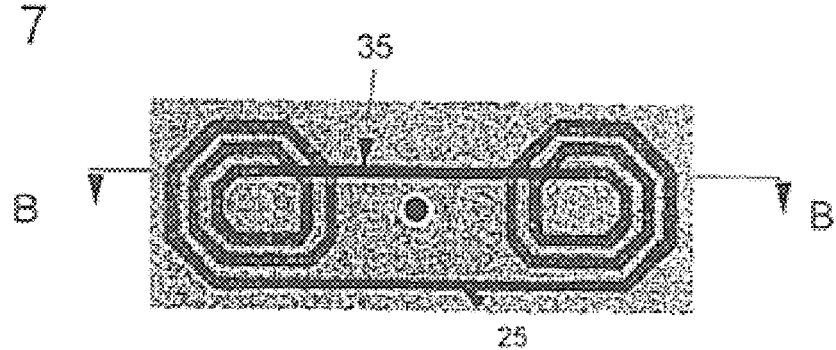
FIG. 7 is another top-down view of the same device taken at a different delimiter B—B, to be used in the cross-section shown in FIG. 8.
Figure 8:
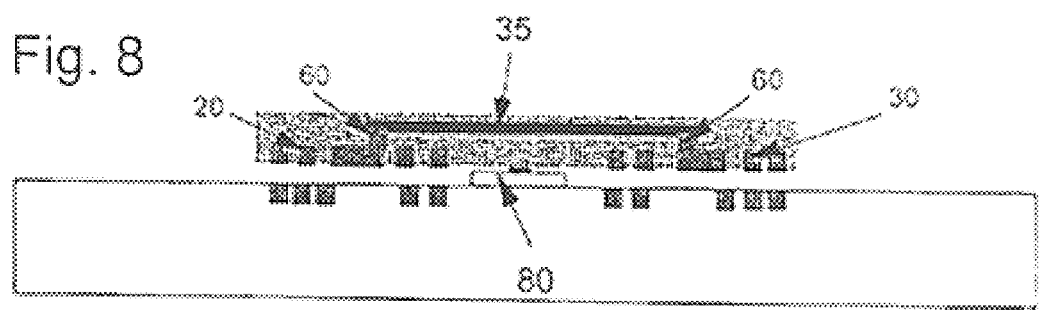
FIG. 8 shows a cross-section of the device of FIG. 7 through delimiter B—B, showing a better perspective of the elements used to connect the movable coils.

FIG. 7 is a top-down view of the movable portion of device 10 seen from a different position, defined by delimiter B–B, for further use in FIG. 8.

Figure 16:
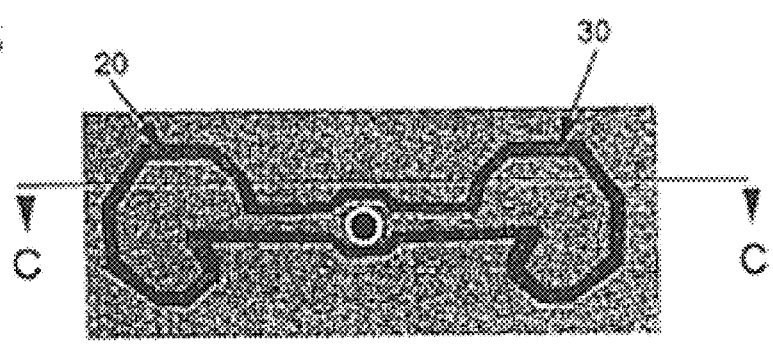
FIG. 16 is a top-down view of another embodiment of the MEMS device displaying a single turn coil and requiring only one level of wiring in the movable part of the device.
Figure 17:
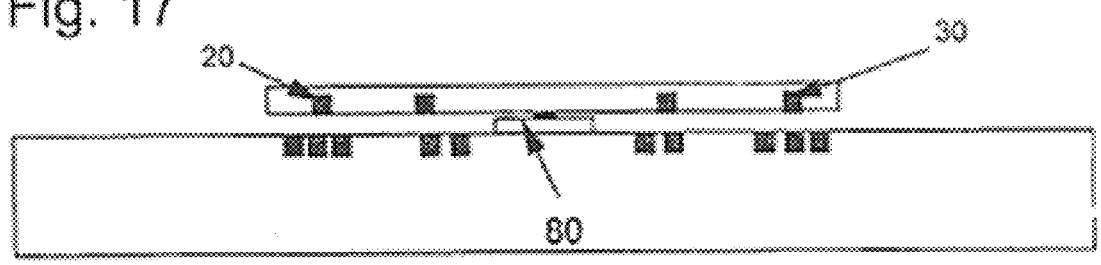
FIG. 17 shows a cross-section of the device shown in FIG. 16 as seen from delimiter C—C.

FIG. 8 is a cross-section perspective of FIG. 7 seen from delimiter B—B. It specifically illustrates the upper connection 35 between the coils and the studs 60 used to fabricate the multilevel construction needed to form true spiral inductors. In this manner, the internal ends of coils 20 and 30 can be interconnected. The outer connector 25 is built on the same layer as the coils and, therefore, does not require studs. It should be noted that this arrangement is not the only one that is possible. FIGS. 16 and 17 described hereinafter will illustrate coils that are constructed using only one level of wiring.

FIG. 9 illustrates a second embodiment of the invention wherein pivot 70 is moved towards one end of the moving portion of the device 10 and additional stationary coils 42 and 45 are incorporated alongside coils 40 and 50. This illustrates one method of achieving a multi-throw arrangement. In the arrangement shown, output coil 30 can be coupled to any of the stationary coils 42, 45, and 50. The input to the movable coils is supplied by coupling the stationary coil 40 to coil 20. Since pivot pin 70 lies at the center of coil 20, it remains inductively coupled to 40 as the device 10 rotates, as shown in FIG. 9A, wherein comb drive 13 is engaged and the device rotates counterclockwise, while coils 42 and 30 overlap and become inductively coupled.

Figure 10:
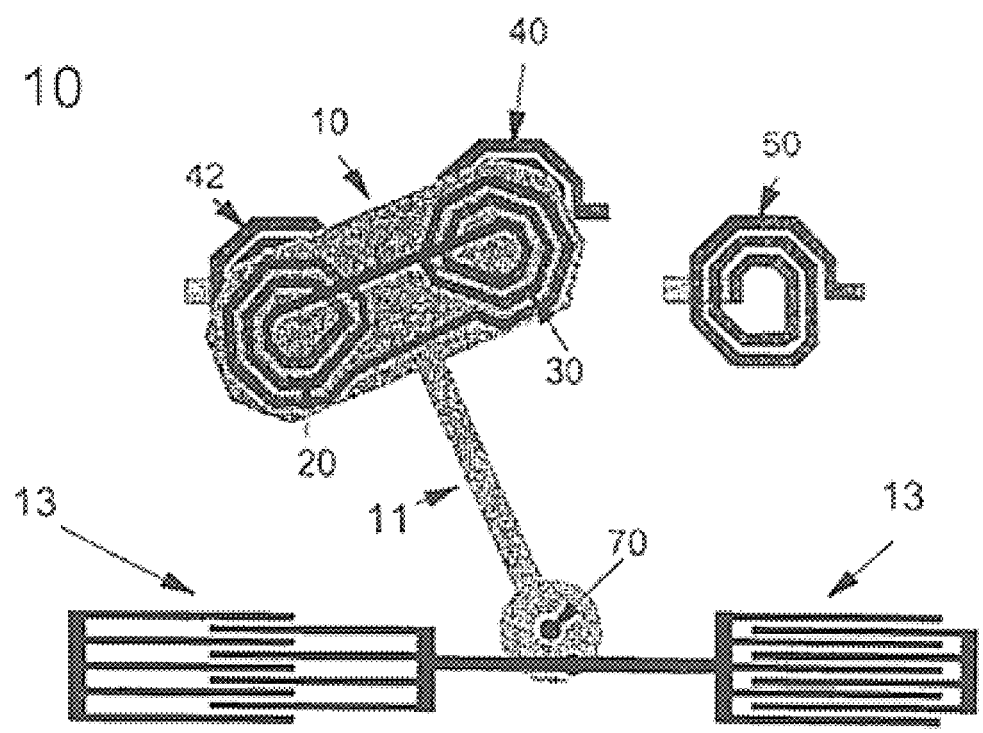
FIG. 10 shows the MEMS switch configured with coils at one end of a moving fulcrum.
Figure 10A:
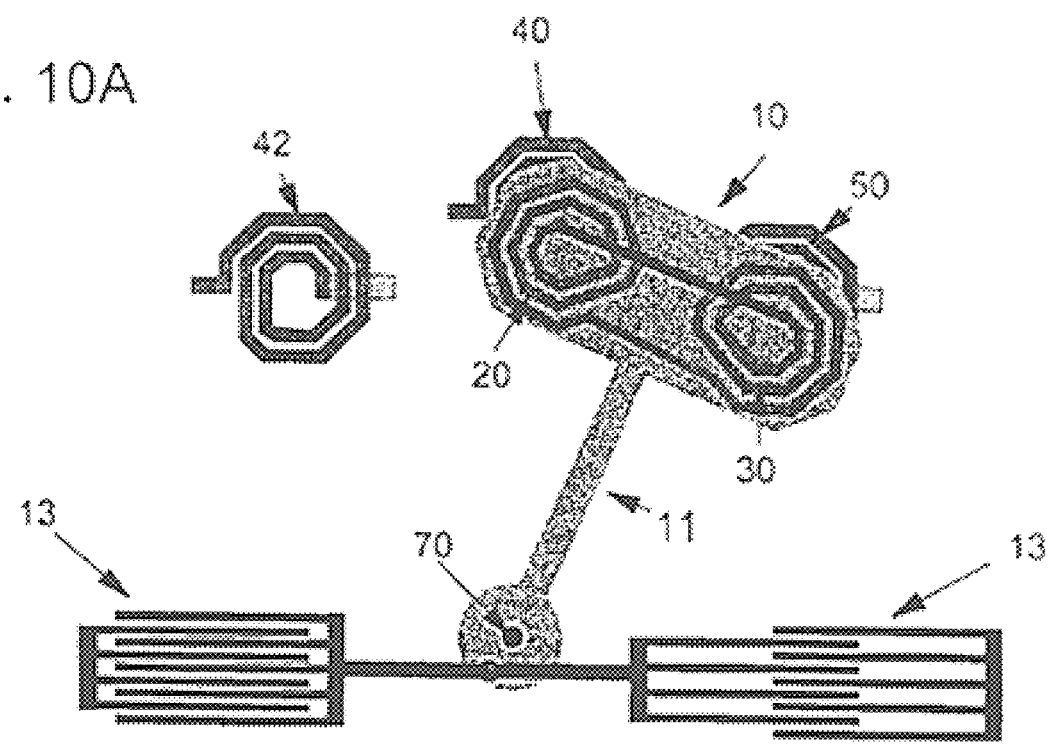

FIG. 10 shows yet another embodiment of the invention, wherein movable coils 20 and 30 are constructed at one end of fulcrum 11. When they are moved, they couple and decouple in pairs with respect to stationary coils 40, 42 and 50. FIG. 10 shows the device 10 in position for coupling to stationary coils 42 and 40. FIG. 10A illustrates device 10 after being rotated clockwise by comb drive 13 such that coil 42 is decoupled, thus allowing coils 40 and 50 to couple with 20 and 30, respectively.

FIG. 11 illustrates another implementation of the invention, wherein the embodiment of FIG. 10 is extended to include a plurality of movable coils sets to form a multi-pole, multi-throw switch. A symmetrical configuration to the one shown in FIG. 10 is used to replicate the coil arrangement of FIG. 10, wherein stationary coils 42A, 40A and 50A are respectfully coupled to moving coils 20A and 30A which are attached to fulcrum 11 and rotated around pivot pin 70. FIG. 11 illustrates the device such that coils 20 and 30 are inductively coupled to 42 and 40, respectively. Concurrently, coils 20A and 30A are coupled to coils 42A and 40A, respectively. In FIG. 11A, the same device is shown in its complementary position after being rotated clockwise by drive 13. In this position, coils 20 and 30 are shown coupled, respectively, to 40 and 50, while coils 20A and 30A are coupled to 40A and 50A, respectively.

FIG. 12 shows yet another embodiment of the invention in which the movable coil device 10 is actuated by a rotary drive (not shown) to provide multi-mode switching. This application is especially advantageous, for instance, for band switching on mobile phones. The drives are known in the art, and fully described, e.g., in U.S. Pat. No. 6,404,599 "High Performance Integrated micro-actuator" to Vegan. FIG. 12 shows the device 10 with coils 20 and 30 coupled to stationary coils 42 and 42A, respectively. FIG. 12A shows the device 10 as it rotates clockwise such that coils 20 and 30 are now coupled to 40 and 40A, respectively. This clockwise rotation moves the device further such that 20 and 30 are, respectively, coupled to 50 and 50A. Rotation may further extend in a clockwise direction for other combinations or it may, at this point, be reversed to repeat the stated coupling and decoupling the moving coils 20 and 30 with the respective stationary coils. The rotary motion can be imparted to device 10 by any number of means currently known in the art.

FIG. 13 illustrates yet another embodiment on the invention in which device 10 is constrained by rail 16 or trench guide and is moved transversely via a linear drive or as illustrated using rack 17 and pinion 18. The device as shown includes only one stationary coil 42 and two movable coils. Other coils may also be incorporated below (or above) device 10 adjacent to stationary coil 42 (similar to 40A and 50A in FIG. 15), all of which are not shown herein for clarity. When device 10 moves back and forth, it couples and decouples to and from the various stationary coils positioned below or (above the device). An example of a rack and pinion MEMS device is described in U.S. Pat. No. 6,305,779, "MEMS ink-jet nozzle cleaning and closing mechanism" to Capurso, et al., which is incorporated herein by reference.

Figure 14:
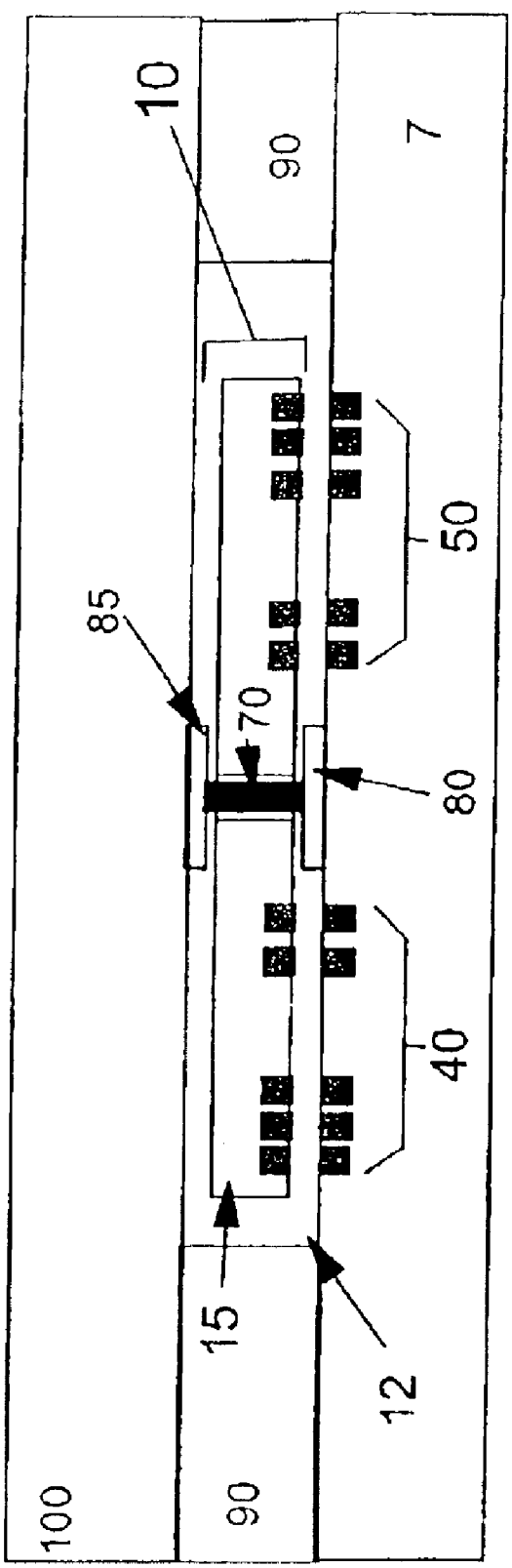
FIG. 14 is a cross-sectional diagram of the MEMS switch depicted in FIGS. 3 through 5 with a fully enclosed cavity encapsulating the switch.

FIG. 14 is a cross-sectional view of the completed device being totally encapsulated for reliability purposes. The lower stationary coils 40 and 50 are constructed at the bottom dielectric layer 7. Additionally, lower shoulder 80 is also built on the same layer 7, and is fabricated with the same material as coplanar dielectric layer 90. Cavity 12 is formed within dielectric layer 90, and provides the space necessary for moving device 10. Upper dielectric layer 100 encases device 10 and provides added mechanical support to the structure, as shown by way of top shoulder 85 contacting pivot pin 70.

Figure 15:
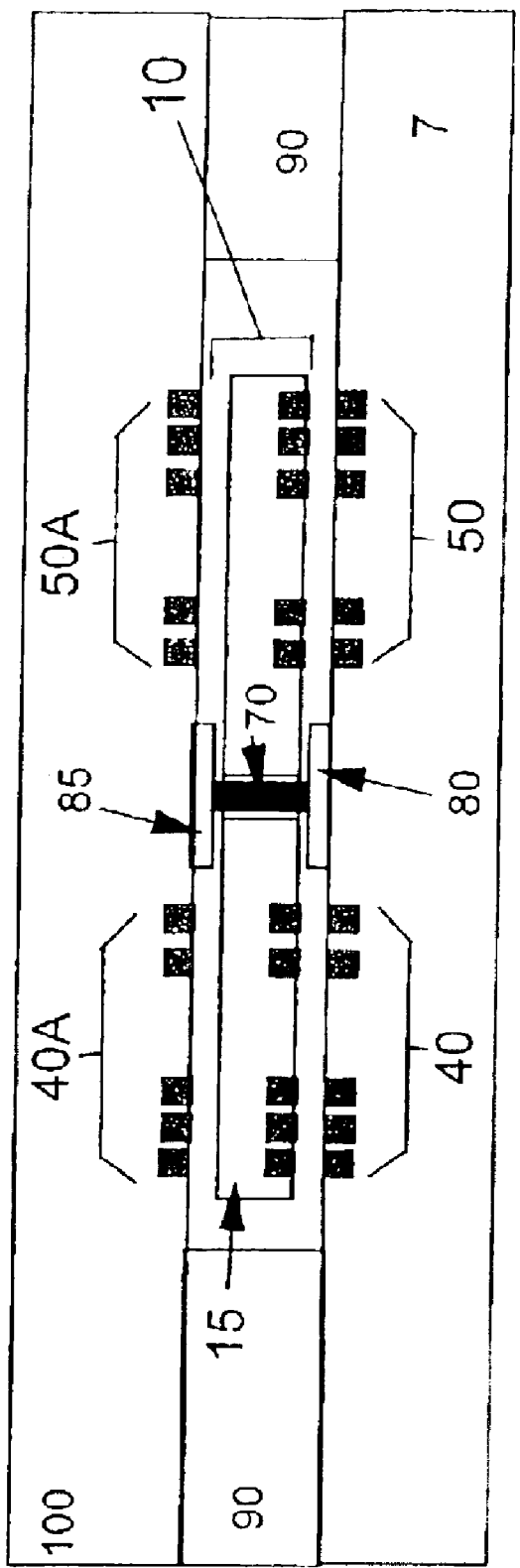
FIG. 15 shows the MEMS switch of FIG. 14 showing an added upper set of coils to enhance functionality.

FIG. 15 is similar to FIG. 14 except that the former illustrates how additional functionality is attained by incorporating additional coils 40A and 50A to the top dielectric 100.

FIG. 16 is a top-down view of device 10 in a simpler one level wiring scheme that eliminates the need for studs (such as 60, in FIG. 8). This embodiment simplifies the construction of device 10 but does not allow for spiral inductors and, therefore, may have limited use for certain applications. Delimiter C—C provides a reference for the cross-sectional view shown in FIG. 17.

FIG. 17 is a diagram representing a cross-sectional view of the structure shown delimiter C—C of FIG. 16. This figure is comparable to the previously described FIG. 8 that illustrates the multilayer wiring needed for spiral inductors.

Figure 18:
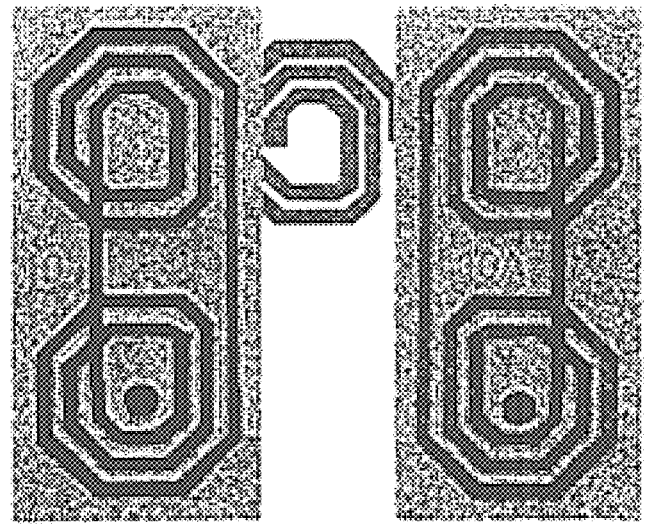
FIGS. 18 and 19 depict the ability to fabricate multiple arrangements of moving coils for more demanding applications.
Figure 19:
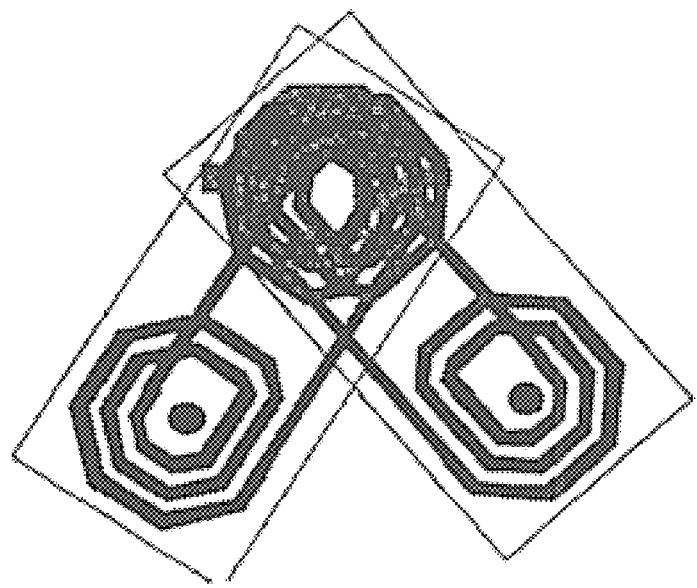

FIG. 18 is yet another embodiment of the invention that utilizes multiple moving devices 10 and 10A relative to stationary coil 30. These devices can be formed at different levels of the structure, such that they move as shown in FIG. 19 in a vertical coupling of more than two inductors concurrently. FIG. 18 shows movable coils 10 and 10A in a decoupled state, while FIG. 19 illustrates the devices of FIG. 18 in a coupled state.

Figure 20:
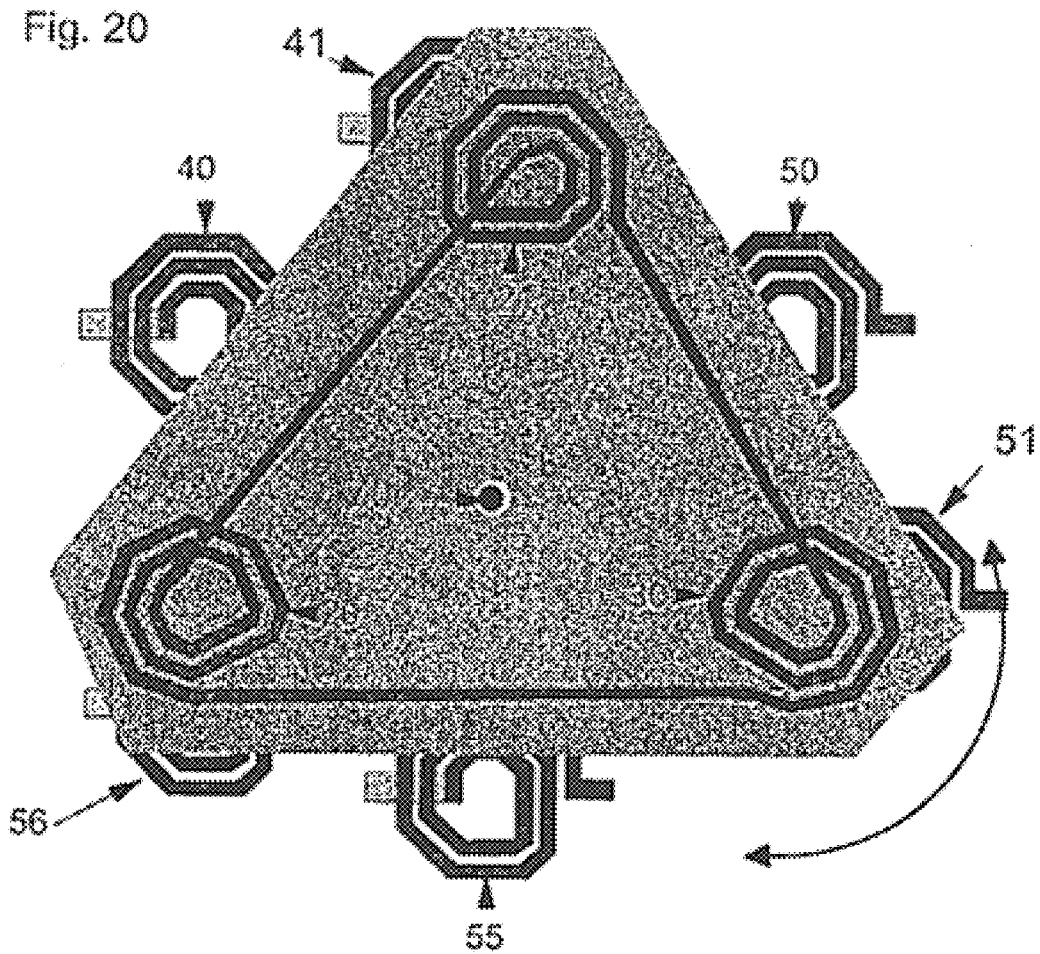
FIG. 20 shows an arrangement capable of coupling more than two pairs of coils at a time.

FIG. 20 illustrates the construction of an inductive switch containing more than two coils, the triangular substrate rotating around pivot pin 70. In the present arrangement, coils 20, 21 and 30 are shown coupled to coils 56, 41 and 51, respectively. The misalignment shown is intended for illustration purposes only. If the device is rotated clockwise, then coils 20, 21 and 30 end up being aligned with coils 40, 50 and 55, respectively.

Figure 21:
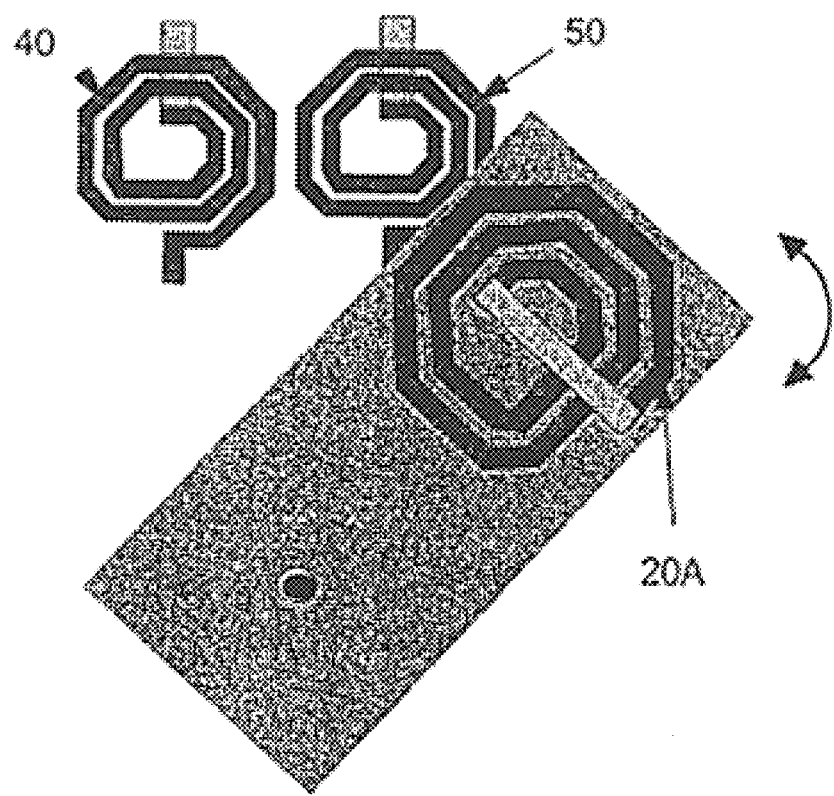
FIG. 21 illustrates how a single movable coil is used to make a switch/balun (BAlanced-UNbalanced) combination.

FIG. 21 illustrates the inductive MEMS switch in a decoupled state, wherein a single movable coil is used to provide a switch/balun combination. As mentioned previously, impedance matching and Balun functions as well as switching are enabled by providing different inductance values at appropriate locations within the inductive switch.

Figure 22:
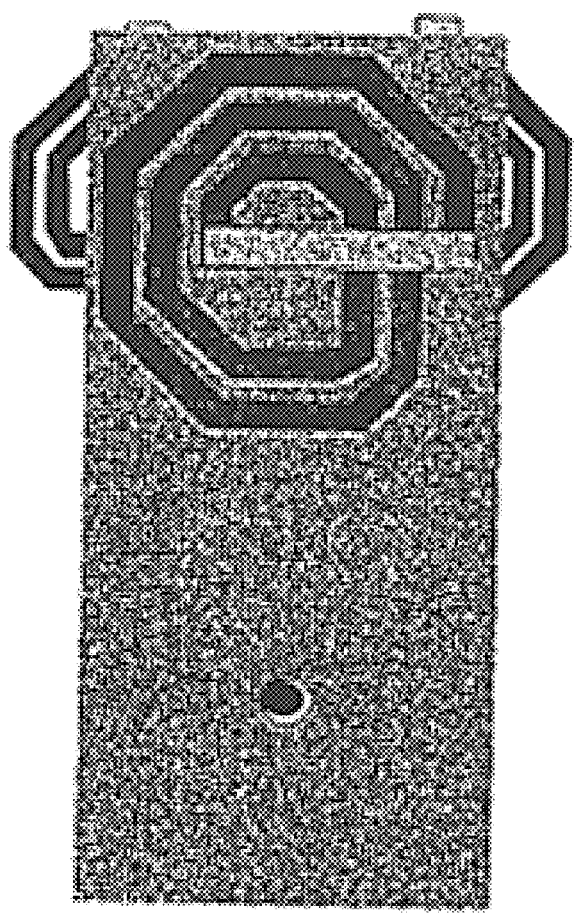
FIG. 22 shows same switch/balun depicted in FIG. 21 in a coupled state.

FIG. 22 illustrates the same device of FIG. 21 in the coupled state. Movable coil/balun 20A couples with both inductors 40 and 50 concurrently.

Figure 23:
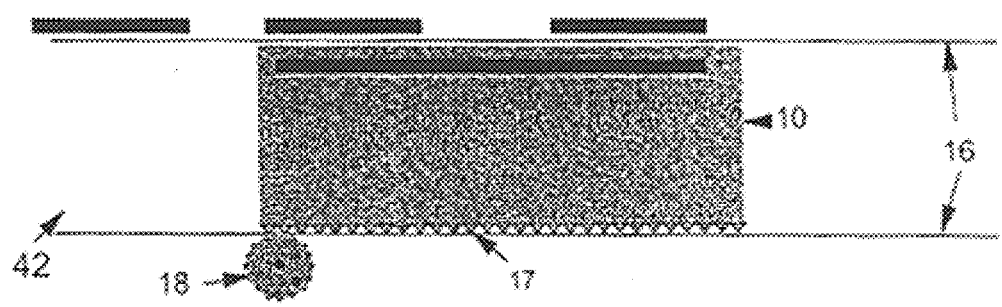
FIG. 23 illustrates a top-down view of a linear arrangement, wherein the coils are constructed vertically (perpendicular) to the plane of the substrate.

FIG. 23 is a top-down view of a linear arrangement, wherein the stationary coils and the movable coil are constructed vertically or perpendicular to the plane of the substrate 10.

Figure 24:
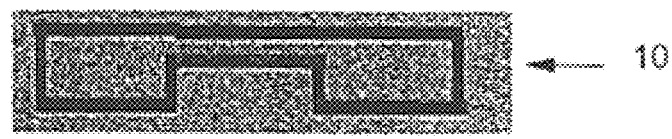
FIG. 24 shows a cross-section of device shown in FIG. 23 that illustrates how the movable coil is constructed within the movable element of the MEMS switch.
Figure 24A:
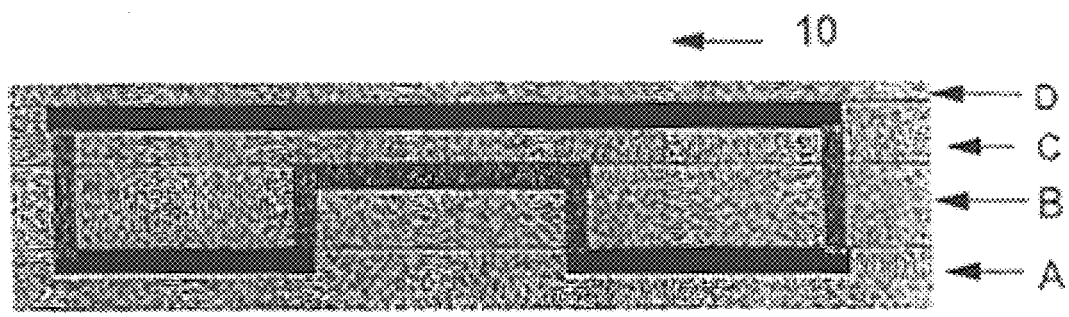

FIG. 24 shows a cross-section of movable coil arrangement 10 of FIG. 23 illustrating how the movable coil is constructed within movable element 10. FIG. 24A shows in more detail the construction of a vertical coil. The structure is fabricated in multiple layers with layer A forming the bottom portion of the inductor loops. This process is similar to a standard damascene line level. Layer B contains portions of the outer and inner vertical conductors in the loops as well as the horizontal inner conductor, similar to the dual damascene structures providing vias and interconnected lines. Layer C contains the upper portion of the vertical loops and the upper horizontal conductor which completes the coil(s), again just as in a dual damascene construction. Layer D is just a top insulating layer that also serves the purpose of encapsulating and protecting the metal.

Figure 25:
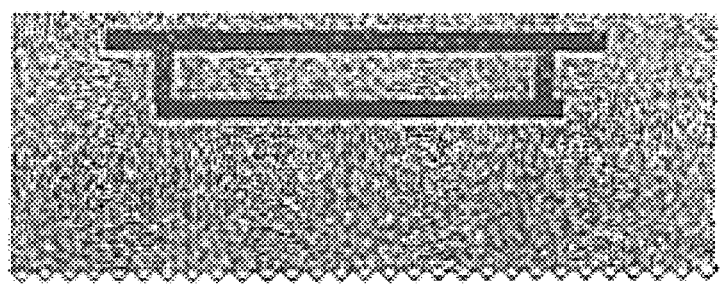
FIG. 25 is another top-down view of a more complex movable coil arrangement similar to that shown in FIG. 23.
Figure 26:
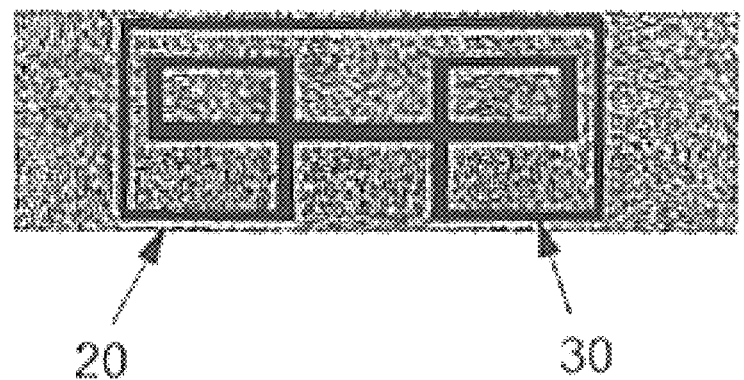
FIG. 26 is a cross-sectional representation of the MEMS switch shown in FIG. 25.
Figure 26A:
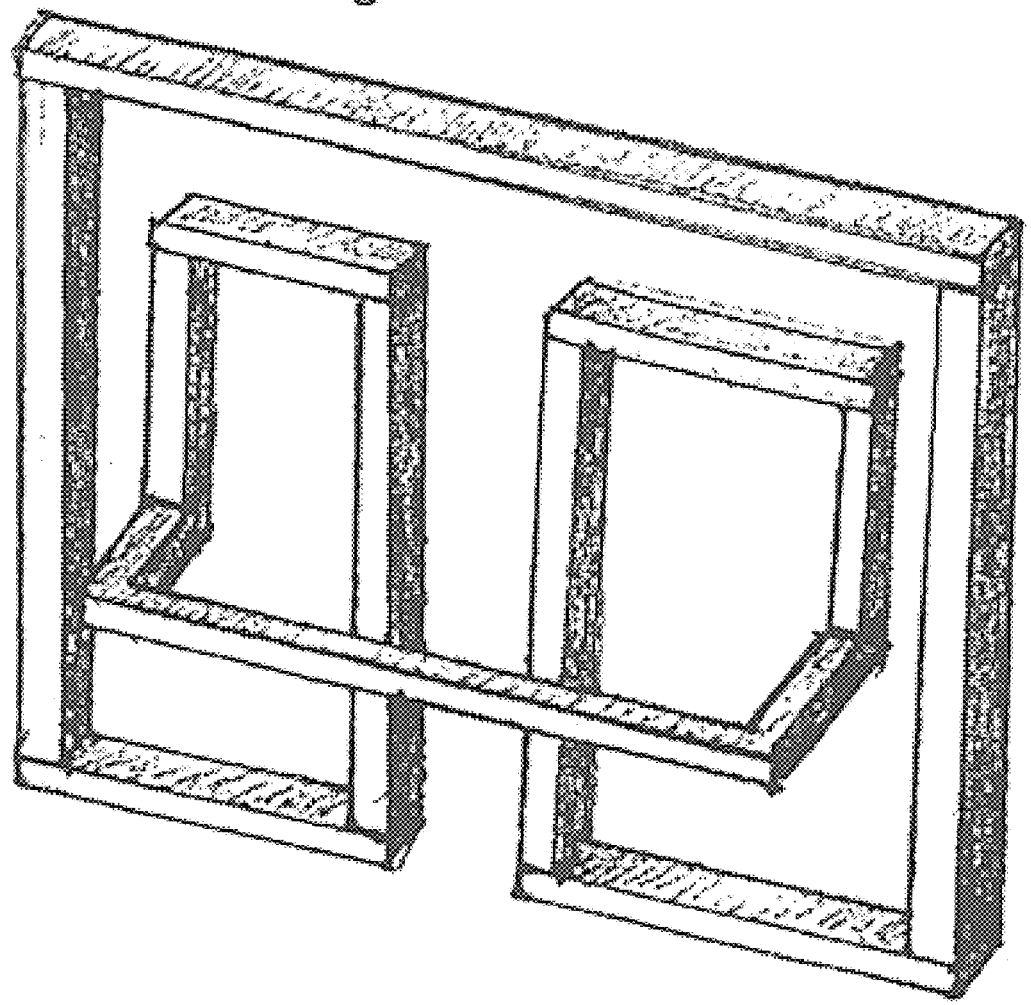
FIG. 26A shows a perspective drawing of the three-dimensional coil arrangement as illustrated in FIGS. 25 and 26.

FIG. 25 is another top-down view of a more complex movable coil arrangement similar to the one illustrated in FIG. 23, while FIG. 26 is a cross-section representation of the structure shown in FIG. 25 with coils 20 and 30 in a vertical three-dimensional structure instead of the horizontal two-dimensional coils described earlier. FIG. 26A shows a perspective drawing of the three-dimensional coil arrangement as illustrated in FIGS. 25 and 26. This arrangement is constructed in a manner similar to that described for FIG. 24, wherein the various segments of the coils are constructed in layers as is, typical done in damascene or dual damascene processing.

The inventive inductive MEMS switch of the invention displays an increased efficiency at higher frequencies, to allow decreasing the size of the coils decreases as the frequency of the signal increases. The increase in efficiency is achieved by the magnetic field coupling between switching components. This magnetic field coupling provides better insertion loss characteristics at higher frequencies without a corresponding decrease in isolation performance. This efficient operation at higher frequencies is contrasted by the increasingly poor performance of typical metal-to-metal and capacitive switches at higher frequencies due to their decreasing isolation performance in the switch-open state. Typical metal-to-metal switches can only handle 2 to 3 GHz reliably whereas the present inventions can readily handle upwards of 25 GHZ. (The efficient operation at higher frequencies is contrasted with the increasingly poor performance of typical metal-to-metal and capacitive switches at higher frequencies due to the decreasing isolation performance in the switch-open state).

Another advantage of the invention resides in the ability of constructing a switch/transformer combination for builtin impedance matching. By selecting the inductance of each portion of the inductive switch appropriately, the input and output impedance of the switch can be adjusted independently. This adjustment allows for impedance matching and simultaneous switching. A special configuration of the transformer can be utilized to create a single-ended to double-ended converter or balun, providing both switching and signal conversion in a single device.

While the invention has been described in conjunction with a preferred embodiment, it is to be understood that many alternatives, modifications and variations will be apparent to those skilled in the art in light of the aforementioned description. Accordingly, it is intended to embrace all such alternatives, modifications and variations which fall within the spirit and scope of the appended claims. All matters set forth herein or shown in the accompanying drawings are to be interpreted in an illustrative and non-limiting sense.

What is claimed is:

1. A semiconductor micro-electromechanical (MEM) switch comprising:
   at least one movable inductor; and
   at least one inductor on a stationary substrate, wherein the relative movement of said at least one movable inductor with respect to said at least one stationary inductor electrically couples and decouples said at least one movable inductor to and from said at least one stationary inductor.

2. The MEM switch as recited in claim 1 further comprising driving means coupled to said at least one movable inductor.

3. The MEM switch as recited in claim 2, wherein said at least one movable inductor and said at least one stationary inductor are respectively placed on a first and second planes or substrates.

4. The MEM switch as recited in claim 3, wherein said first plane is a movable platform above or below said second plane.

5. The MEM switch as recited in claim 4, wherein said driving means are external to said movable platform, said driving means providing a rotational movement.

6. The MEM switch as recited in claim 4, further comprising a second and third inductors on said movable platform interconnected to each other at respective ends thereof.

7. A MEM switch on a stationary substrate comprising:
   an arrangement of inductors on said stationary substrate grouped in close proximity of each other, and at least one inductor separate from said arrangement of inductors; and
   two inductors interconnected to each other on a rotating platform, wherein one of said inductors on said rotating platform alternatively couples and decouples one of said inductors in said arrangement of inductors by the rotation of rotating platform, while the second inductor on said rotating platform couples and decouples said at least one inductor separate from said arrangement of inductors on said stationary substrate.

8. The MEM switch as recited in claim 7 wherein said rotating platform is attached to a pivot pin at one end thereof.

9. The MEM switch as recited in claim 7 wherein said rotating platform is attached to a fulcrum, said fulcrum rotating about said pivot pin at one end thereof.

10. A MEM switch comprising:
    a first and second arrangement of inductors on a stationary substrate; and
    two pairs of inductors, said two pairs respectively placed on two movable platforms, said movable platforms being coupled to each other at respective ends of a fulcrum, said fulcrum being attached to a pivot pin allowing a rotating movement of said movable platforms, wherein said rotational movement couples and decouples respective pairs of said inductors on said movable platforms to and from respective pairs of said first and second arrangement of inductors on said stationary substrate.

11. A MEM switch comprising:
    an arrangement of inductors on a stationary substrate; and
    a movable platform rotating about a pivot pin, said movable platform having two inductors thereon, said movable platform allowing each of said inductors thereon alternatively couple and decouple inductors of said arrangement on said stationary substrate.

12. A semiconductor multi-pole inductive MEM switch comprising:
    a plurality of inductors on a stationary substrate;
    at least one inductor on a movable platform, said moving platform being coupled to driving means providing a lateral displacement of said movable platform with respect to said stationary substrate, said movable platform coupling and decoupling said at least one inductor to said plurality of inductors on said stationary substrate.

13. The semiconductor multi-pole inductive MEM switch as recited in claim 12, wherein said inductors form either a single closed loop or a spiral of consisting of multiple loops.

14. A semiconductor inductive MEM switch comprising:
    at least one inductor on a stationary platform;
    two pairs of inductors, each of said two pair being respectively placed on one rotating platform, each of said rotating platforms having an end thereof attached to a pivot pin, wherein the rotational movement of said two platforms alternatively couples and decoupled said pairs of inductors to and from said at least one inductor on a stationary platform.

15. A semiconductor inductive MEM switch comprising:
    an arrangement of inductors on a stationary substrate;
    a plurality of interconnected inductors on a rotating platform, wherein said rotating platform couples and decouples said plurality of interconnected inductors to and from said arrangement of inductors on said stationary substrate.

16. The semiconductor inductive MEM switch as recited in claim 15, wherein said rotating platform is attached to a pivot pin on or about the center of gravity of said rotating platform, said pivot pin being anchored on said stationary substrate.

17. A semiconductor MEM switch-switch combination comprising:
    a plurality of inductors on a stationary substrate;
    a rotating platform having at least one inductor thereon, said rotating platform rotating around a pivot pin attached at an end thereof, said pivot pin being anchored on said stationary substrate, said rotating platform alternatively coupling and decoupling said plurality of inductors to and from said inductor on said stationary substrate.

* * * * *